United States Patent [19]

Jarvela

[11] 4,000,509
[45] Dec. 28, 1976

[54] HIGH DENSITY AIR COOLED WAFER PACKAGE HAVING IMPROVED THERMAL DISSIPATION

[75] Inventor: Robert A. Jarvela, Wappingers Falls, N.Y.

[73] Assignee: International Business Machines Corporation, Armonk, N.Y.

[22] Filed: Mar. 31, 1975

[21] Appl. No.: 563,550

[52] U.S. Cl. .................. 357/81; 357/74; 357/79; 357/80; 357/82

[51] Int. Cl.² .................. H01L 23/02; H01L 23/42; H01L 39/02; H01L 25/04

[58] Field of Search .................. 357/80, 81, 82, 79, 357/74

[56] References Cited
UNITED STATES PATENTS

| | | | |
|---|---|---|---|
| 3,365,620 | 1/1968 | Butler et al. | 357/82 |
| 3,741,292 | 6/1973 | Kumar et al. | 357/82 |
| 3,805,123 | 4/1974 | Rieger | 357/81 |
| 3,846,824 | 11/1974 | Bell | 357/81 |

Primary Examiner—Edward J. Wojciechowicz
Attorney, Agent, or Firm—James M. Thomson

[57] ABSTRACT

A high density low profile air cooled wafer package including flip chip and embedded logic or memory islands upon a wafer package mounted within a heat dissipating cover having improved thermal dissipation. Heat dissipation is achieved through a thermal grease interface provided between the wafer carrier and the heatsink cover, with pressure being applied to the interface by partially deflected electrical connectors secured there between.

5 Claims, 3 Drawing Figures

HIGH DENSITY AIR COOLED WAFER PACKAGE HAVING IMPROVED THERMAL DISSIPATION

BACKGROUND OF THE INVENTION

The present invention relates to a high density, low profile air cooled wafer package for semiconductor devices. More particularly, the invention concerns a non-stackable aircooled package which includes flip chip and embedded logic on a wafer and multi layer ceramic flip chip packgaging within a housing having improved thermal dissipation characteristics.

The microminiaturization of electrical circuits and particularly of semiconductor devices has led to an increasing need for semiconductor packages which permit the association of a high density of semiconductor chips within a package which meets heat dissipation requirements for the electrical circuitry incorporated therein. In some advance systems, the trend is to place logic and memory circuits within sealed fluid containing modules to enhance the heat dissipation characteristics of the modules. This is an expensive and more complicated arrangement, in general, than packages which can be satisfactorily cooled by circulated air flow.

However, limitations do exist with high density, high power packages as to the amount of heat which can be dissipated by air cooling. There limitations particularly relate to the amount of heat which can be transferred from a given arrangement of semiconductor chips to a heat sink cover which is exposed to air flow. Due to the requirements in electronic circuitry, and particularly circuits associated with computer applications, a continuing need exists for high density wafer packages which provide improved thermal dissipation and which, therefore, can be utilized in connection with air cooled assemblies.

SUMMARY OF THE INVENTION

The present invention provides an improved wafer package capable of high density utilization in an air cooled environment. The package includes capability for flip chip and embedded logic or memory islands upon a wafer as well as capability of flip chips upon a multi-layer ceramic module packaged within a housing having improved thermal dissipation achieved through use of a novel thermal grease interface between a wafer carrier and a heatsink cover of the assembly. The thermal dissipation of the assembly is further enhanced by pressure applied through the interface, which is produced by application of force to the wafer carrier by slightly deflected jumper connections between the wafer carrier assembly and a pin carrier assembly of the package.

BRIEF DESCRIPTION OF THE DRAWINGS

The foregoing and other features and advantages of the invention will become more apparent from the following detailed description of the invention taken in conjunction with the accompanying drawings wherein.

DETAILED DESCRIPTION OF THE INVENTION

Figure 3:
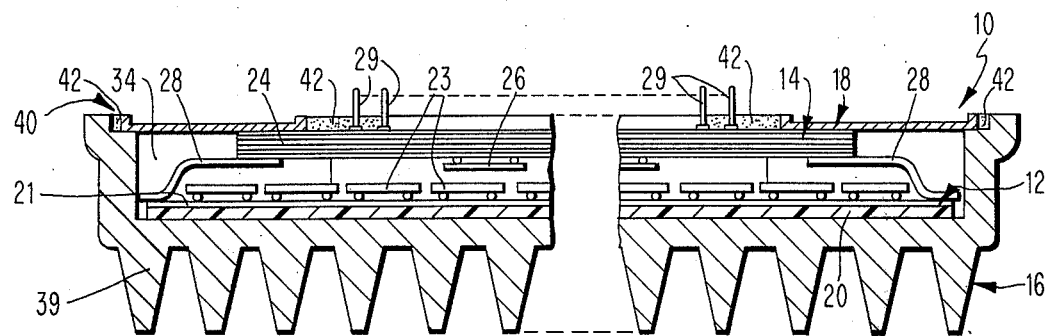
FIG. 3 comprises a vertical sectional view of the assembly taken along line 3—3 in FIG. 2.

Referring now to the drawings, one preferred embodiment of the wafer package of the invention is illustrated generally indicated by the numeral 10, including a wafer carrier assembly 12, a pin carrier assembly 14, a heat sink cover 16 and assembly frame 18 and a thermal grease interface 20 which is best seen in FIG. 3.

The wafer carrier assembly generally consists of a circular silicon wafer 21 having signal and power distribution circuit networks formed thereon. The circuit networks are provided by copper, aluminum and glass or polyimide processed in conventional fashion. Silicon wafer 21 is high temperature solder bonded to a molybdenum stiffener not illustrated to provide mechanical strength for the assembly.

In the embodiment illustrated, wafer assembly 12 also supports a plurality of flip chip circuits 23 which are mounted on the upper side of the wafer, as viewd in FIG. 3, in electrical association with the circuit networks on the wafer in conventional fashion. Alternatively, the wafer assembly can be utilized in connection with embedded circuit islands or with a combination of flip chip devices and embedded circuit islands, if preferred.

Figure 1:
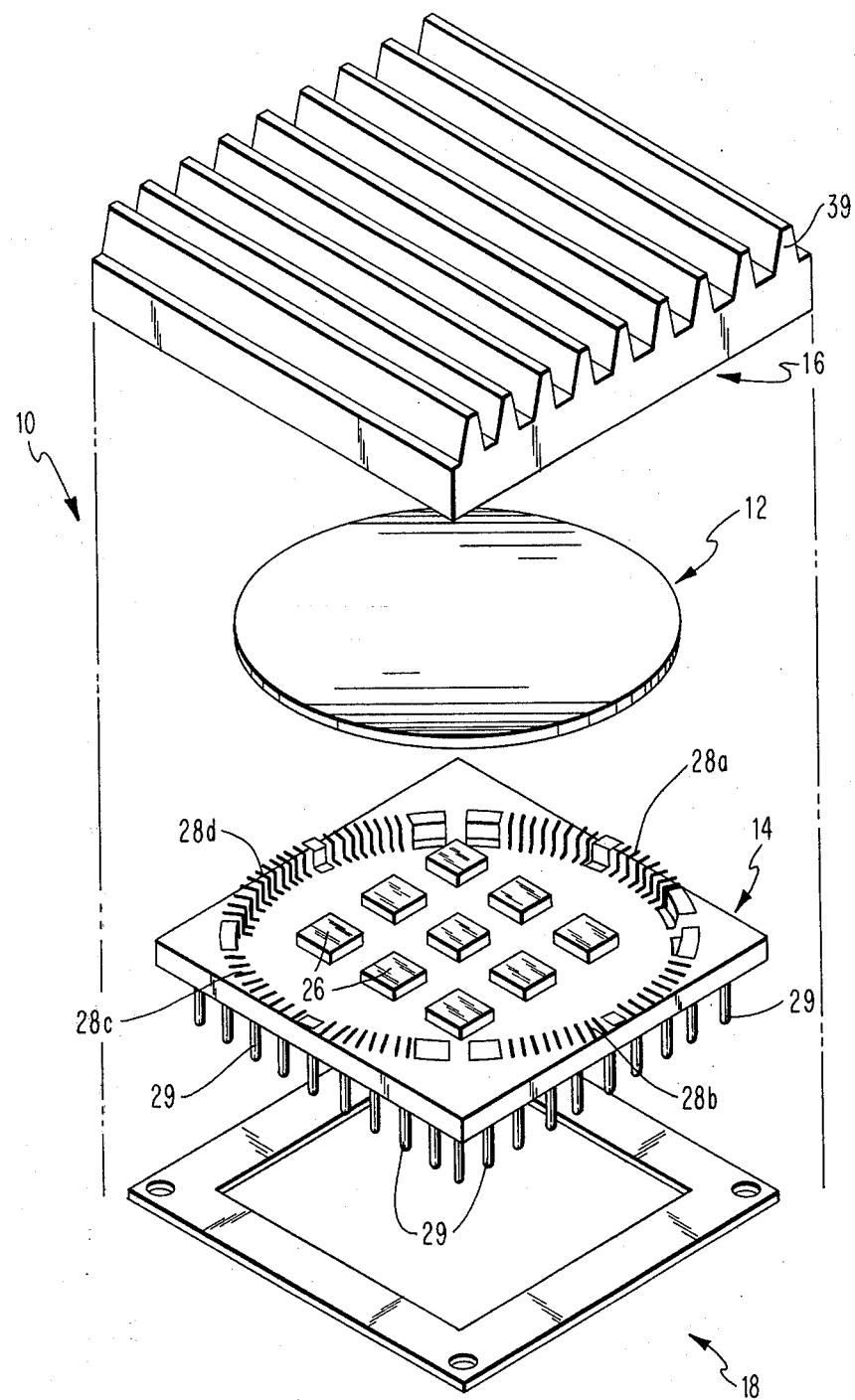
FIG. 1 comprises an exploded view of the components of the package.
Figure 2:
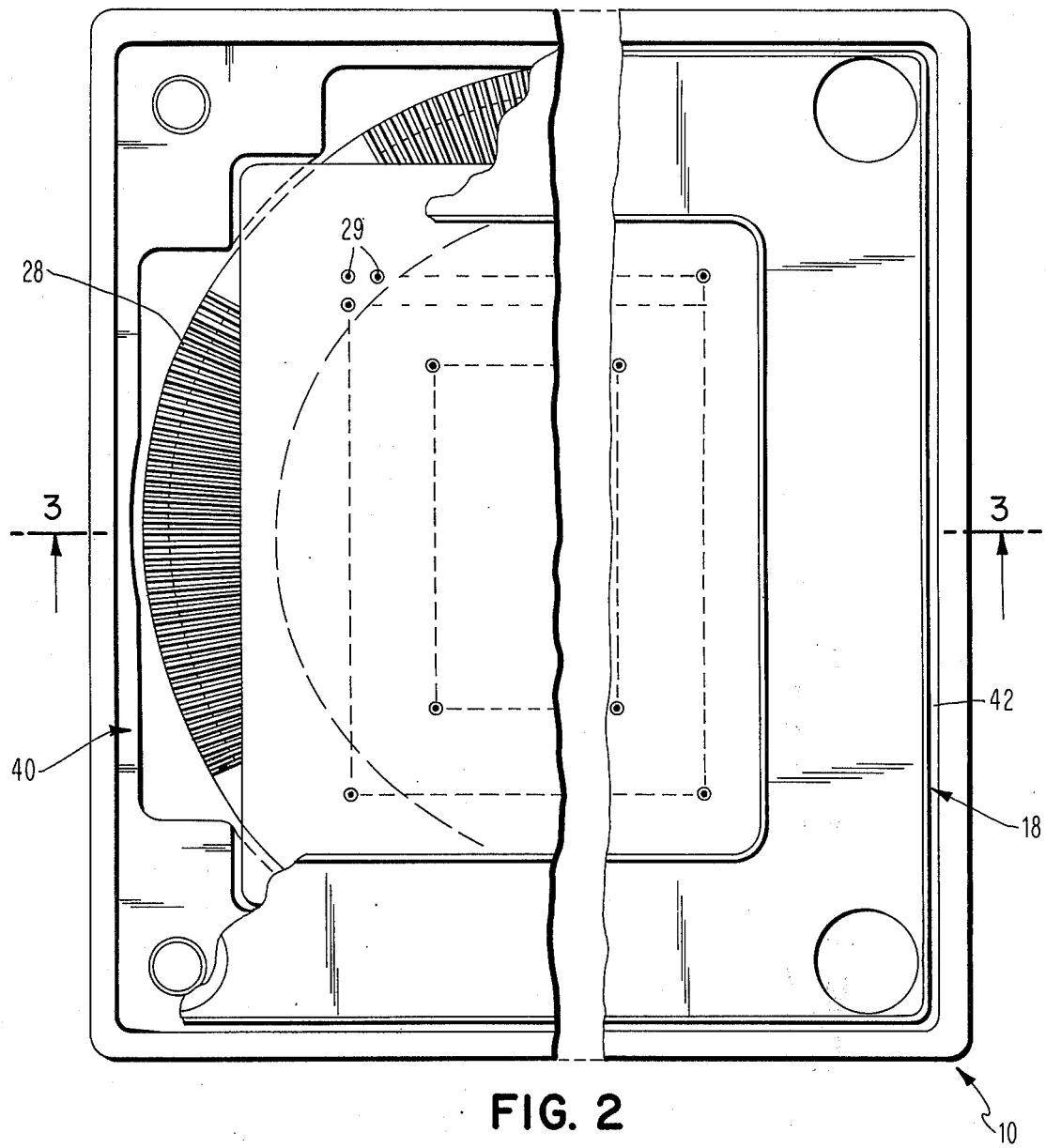
FIG. 2 comprises an enlarged view of one side of the package with parts broken away.

Pin carrier assembly 14 generally comprises a multi-layer ceramic substrate 24 which is populated, again as desired, with flip chip devices, chip capacitors, chip terminators or a combination of these elements. Typical flip chip devices 26 are illustrated in FIGS. 1 and 3. In addition, the pin carrier assembly is provided with electrical signal connection members or jumpers 28 which are arranged in four groups, 28a –28d, respectfully, generally spaced along a circular outline on the periphery of the circular pin carrier assembly. Furthermore, a plurality of pins 29 are provided, being secured to the pin carrier assembly in conventional fashion and extending therethrough to intercommunicate between chip devices 26 and jumpers 28. As best shown in FIG. 3, members 28 generally communicate with corresponding signal distribution networks or conductive paths 31 provided along the periphery of wafer carrier assembly 12. Furthermore, connection members 28 are soldered to the perimeter of wafer 21 thereby accomplishing the mechanical interconnection of the two assemblies. This provides a satisfactory mechanical interconnection between the pin carrier assembly and the wafer assembly which can be disassembled by heating the easily accessible connections which extend beyond the ceramic carrier. Such a design greatly facilitates repair of the overall package when required. Futhermore, due to the location of the signal jumpers at the periphery of the package, the finished assembly of the wafer carrier and pin carrier can be conveniently tested through the pin input/output terminals of the package.

The composite pin carrier assembly and wafer carrier assembly is fitted within a recessed portion 34 formed within heatsink cover 16. The heatsink cover is otherwise provided with suitable heat dissipating fins 39 on one side of its periphery and a recessed portion 40 formed about the periphery of the other side adapted to accommodate the outer edge of assembly frame 18. As shown, assembly frame 18 overlies an outer periphery of the pin carrier assembly and provides a central opening for pins 29 to extend upwardly in an easily accessible location on the other side of the package. A layer 42 of potting material can be suitably applied about the pins, as well as about the outer periphery of the assembly to complete the package.

Heat dissipation between the pins on the assembly and the wafer carrier is enhanced through the use of a thin layer 20 of thermal grease which is especially suited for enhancement of heat transfer. For example, layer 20 can be comprised of silicon lubricants mixed with high conductivity filler materials. Such material is capable of providing a thermal conductivity which is higher than attainable through air. The thermal grease interface is further enhanced as a heat transfer layer by pressure applied between the wafer carrier and the back of the heatsink. In the embodiment illustrated, this pressure is applied through preflecture or deflection of members 28, which are formed of suitable spring material, under the influence of frame 18. Other suitable means of applying pressure could be utilized, if desired, but it has been found that preflecture of the signal jumpers is a convenient and inexpensive way to maintain even pressure upon the thermal grease interface. It should be noted that any mismatches in the thermal expansion coefficient of the members of the package are accommodated by freedom of movement of the memory frame wafer with respect to these interfaces and signal jumpers.

The described package provides a capability in a high density of combining flip chip on wafer with embedded memory or logic islands on a wafer, and multilayer ceramic flip chip packaging in the same assembly with improved thermal dissipation. Further more, the package provides an excellent thermal path between components mounted on or within the wafer substrate to a cover heatsink which can be located in an adjacent air stream. The assembly further provides easily accessible pin locations on the other side of the package for testing purposes.

While the invention has been particularly shown and described with reference to the preferred embodiment(s) thereof, it will be understood by those skilled in the art that various changes in form and details may be made therein without departing from the spirit and scope of the invention.

What is claimed is:

1. A high density capability air coolable semiconductor wafer package comprising:
   a heat sink cover having air cooling fins projecting from at least one side thereof and a wafer receiving portion formed thereon,
   a silicon wafer retained adjacent said wafer receiving portion, said wafer being adapted to have electrical semiconductor device chips associated therewith,
   electrical circuit path means for providing electrical signals to said chips,
   a resilient thermal grease interface between said wafer and the wafer receiving portion of said heatsink cover to facilitate transmission of heat therebetween; and
   means for applying force between said wafer and the heatsink cover to apply pressure to said thermal grease interface.

2. A wafer package as described in claim 1 wherein said means for applying force includes a plurality of elongate, flexible signal connection members formed of conductive spring material extending between said wafer and a pin carrier assembly supported adjacent said wafer and retained together by an assembly frame whereby said connection members are slightly compressed to cause pressure at said thermal grease interface.

3. A wafer package as described in claim 2 wherein said thermal grease interface is comprised of silicon lubricants mixed with high conductivity filler materials.

4. The wafer package assembly of claim 2 wherein said wafer is of circular configuration and wherein said pin carrier assembly comprises a rectangular multilayer ceramic wafer having semiconductor chips secured thereto and said signal connection members are arranged in a circular configuration on one side of said pin carrier assembly, each of said members having one end in contact with the pin carrier assembly and another end in contact with the periphery of said wafer in electrical connection with conductive paths formed upon said wafer.

5. A high density air cooled semiconductor wafer package comprising:
   a heatsink cover having fins formed on at least one side thereof adapted to be exposed to airflow and having an internal chamber formed therein opening to the other side of said cover,
   a circular silicon wafer housed within said internal chamber having semiconductor devices associated therewith in electrical contact with conductive paths formed upon said wafer, said conductive paths extending to the periphery of said wafer,
   a pin carrier wafer also housed within said internal chamber proximate to said silicon wafer, said interior wafer having conductive pins secured upon one side thereof and extending into conductive association with conductive paths formed upon the other side of said carrier wafer, an assembly frame overlying part of said wafer to retain the carrier wafer and the ceramic wafer within said chamber,
   a thin resilient thermal grease layer between said silicon wafer and said heatsink cover, and
   a plurality of elongate, flexible signal connection members secured between the periphery of the ceramic wafer and said carrier wafer providing electrical contact paths therebetween, said signal connection members being formed of resilient, conductive spring material and being slightly flexed whereby said members exert force upon said silicon wafer to retain said wafer against the heatsink cover and place said thermal grease layer under a predetermined pressure to facilitate heat transfer through said grease layer.

* * * * *